United States Patent [19]

Asano et al.

[11] Patent Number: 4,719,369
[45] Date of Patent: Jan. 12, 1988

[54] OUTPUT CIRCUIT HAVING TRANSISTOR MONITOR FOR MATCHING OUTPUT IMPEDANCE TO LOAD IMPEDANCE

[75] Inventors: Michio Asano, Tokorozawa; Akira Masaki, Musashino; Kenichi Ishibashi, Kokubunji, all of Japan

[73] Assignee: Hitachi, Ltd., Tokyo, Japan

[21] Appl. No.: 894,103

[22] Filed: Aug. 7, 1986

[30] Foreign Application Priority Data

Aug. 14, 1985 [JP] Japan .................. 60-177509
Nov. 8, 1985 [JP] Japan .................. 60-248811

[51] Int. Cl.⁴ .................. H03K 17/16; H03K 17/687
[52] U.S. Cl. .................. 307/443; 307/451; 307/469; 307/475; 307/263
[58] Field of Search .................. 307/200 B, 443, 448, 307/475, 451-453, 468-469, 481, 494, 572, 577, 579, 584, 585, 263, 264

[56] References Cited

U.S. PATENT DOCUMENTS

| | | | |
|---|---|---|---|
| 4,414,480 | 11/1983 | Zasio | 307/443 |
| 4,424,456 | 1/1984 | Shiraki et al. | 307/451 X |
| 4,430,583 | 2/1984 | Shoji | 307/448 |
| 4,477,741 | 10/1984 | Moser, Jr. | 307/443 X |
| 4,507,576 | 3/1985 | McCracken et al. | 307/443 X |
| 4,518,873 | 5/1985 | Suzuki et al. | 307/451 |
| 4,567,378 | 1/1986 | Raver | 307/263 X |
| 4,593,203 | 6/1986 | Iwahashi et al. | 307/263 X |
| 4,609,832 | 9/1986 | Mehl | 307/494 X |
| 4,609,836 | 9/1986 | Koike | 307/451 |
| 4,622,482 | 11/1986 | Ganger | 307/263 X |
| 4,634,893 | 1/1987 | Craycraft et al. | 307/468 X |

Primary Examiner—S. D. Miller
Assistant Examiner—D. R. Hudspeth
Attorney, Agent, or Firm—Antonelli, Terry & Wands

[57] ABSTRACT

An output circuit comprises an output transistor circuit for applying an output signal to a transmission line connected to an output terminal, a circuit for driving the output transistor circuit in response to an input signal applied to an input terminal, and a control circuit by which the signal amplitude of a first wave applicable to the transmission line with a load connected to the output terminal through the transmission line is rendered approximately one half of the output signal amplitude with a load directly connected to the output terminal. The control circuit includes a monitoring transistor within the same chip as the output transistor circuit, a selected one of the output resistance and input signal of the output transistor circuit being controlled in accordance with the magnitude of the drain current of the monitoring transistor to adjust the amplitude of the signal applied to the transmission line. Transmission with transmitting and receiving ends having a well-defined transmission waveform is obtained, thereby making possible high-speed signal transmission between LSI chips.

13 Claims, 7 Drawing Figures

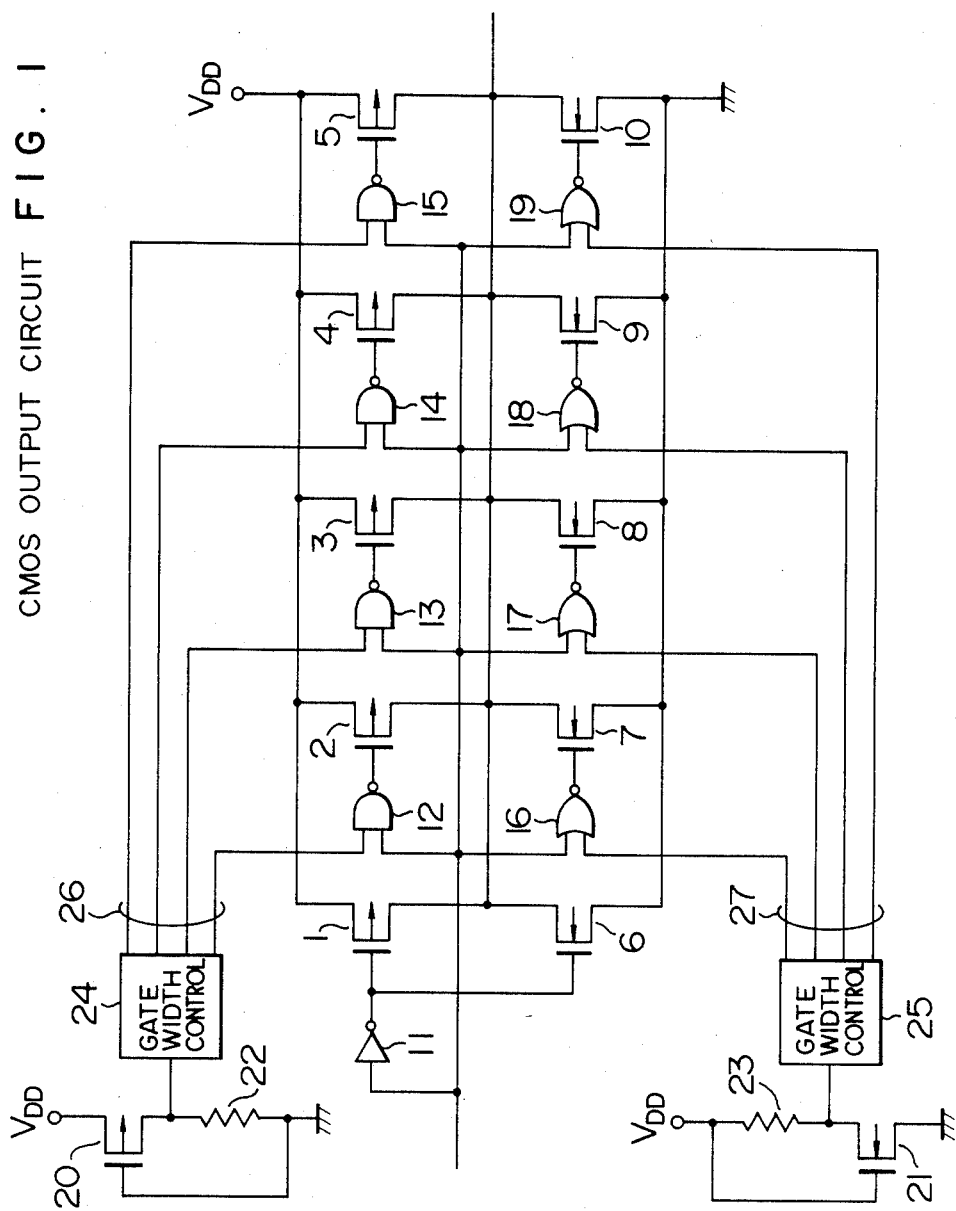

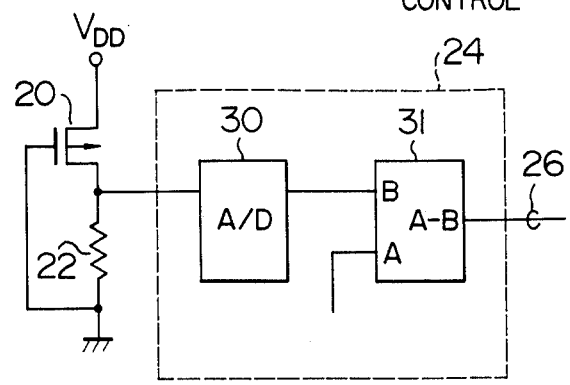
FIG. 2 GATE WIDTH CONTROL
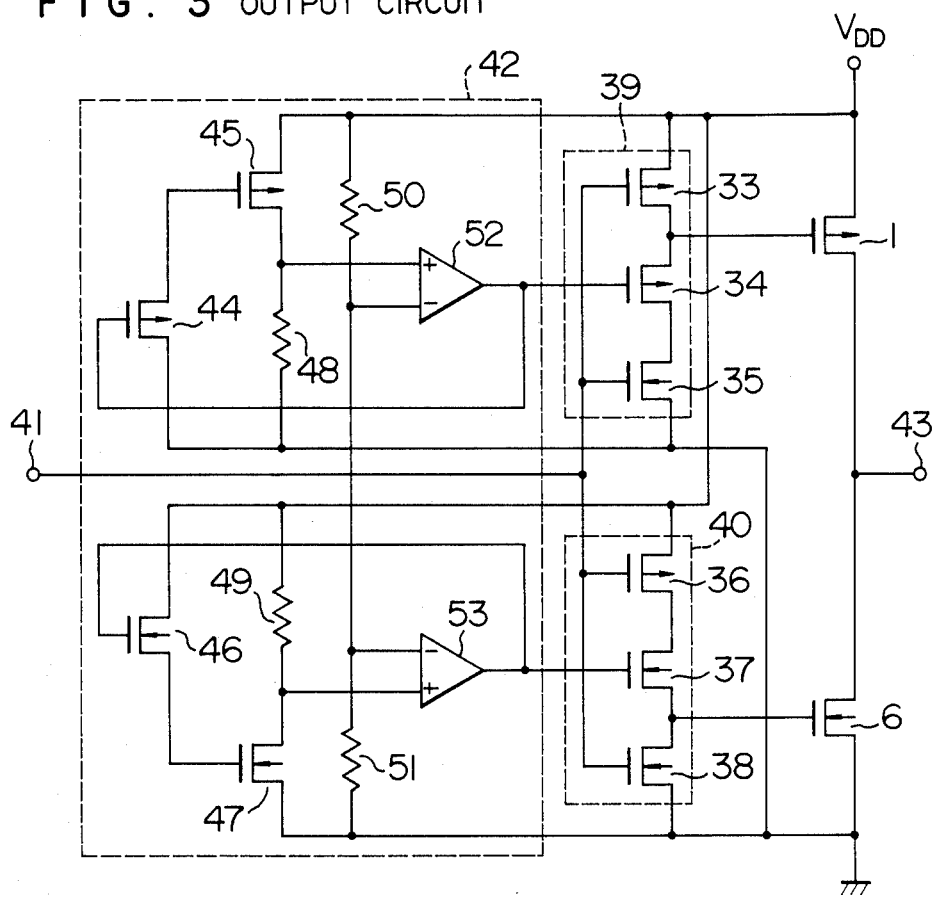
FIG. 3 OUTPUT CIRCUIT

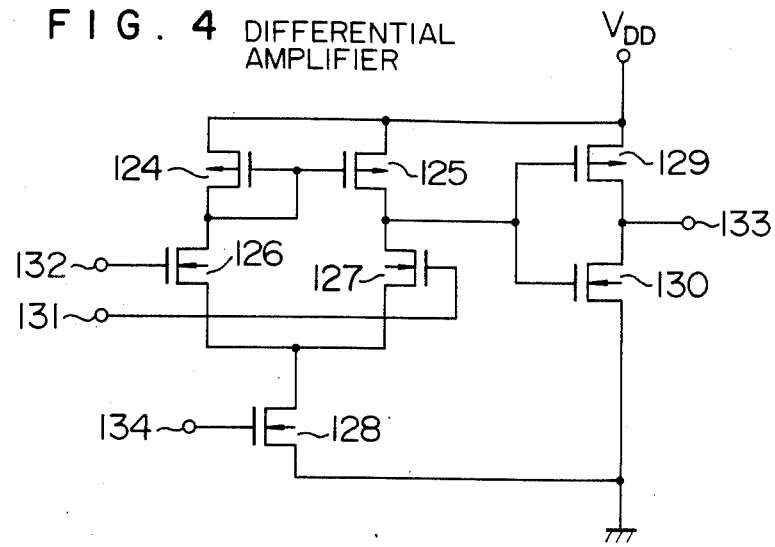
FIG. 4 DIFFERENTIAL AMPLIFIER
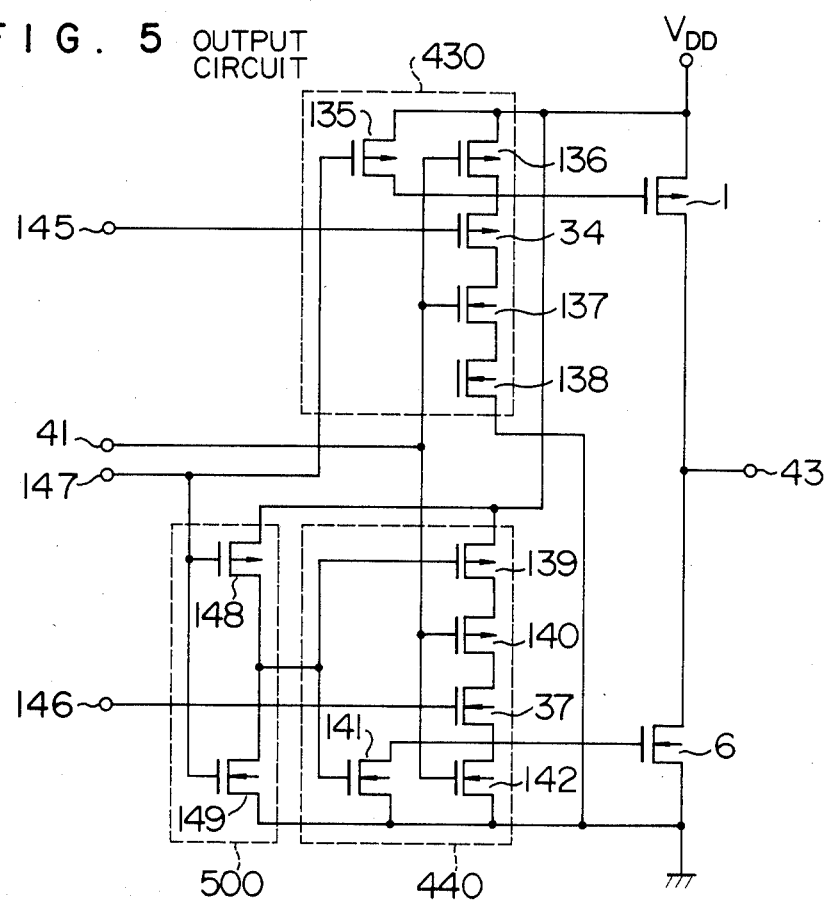
FIG. 5 OUTPUT CIRCUIT

FIG. 6 OUTPUT CIRCUIT
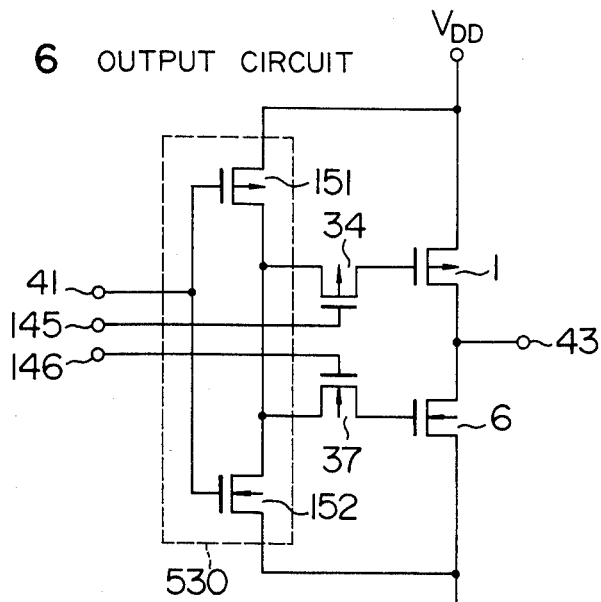
FIG. 7 OUTPUT CIRCUIT 109
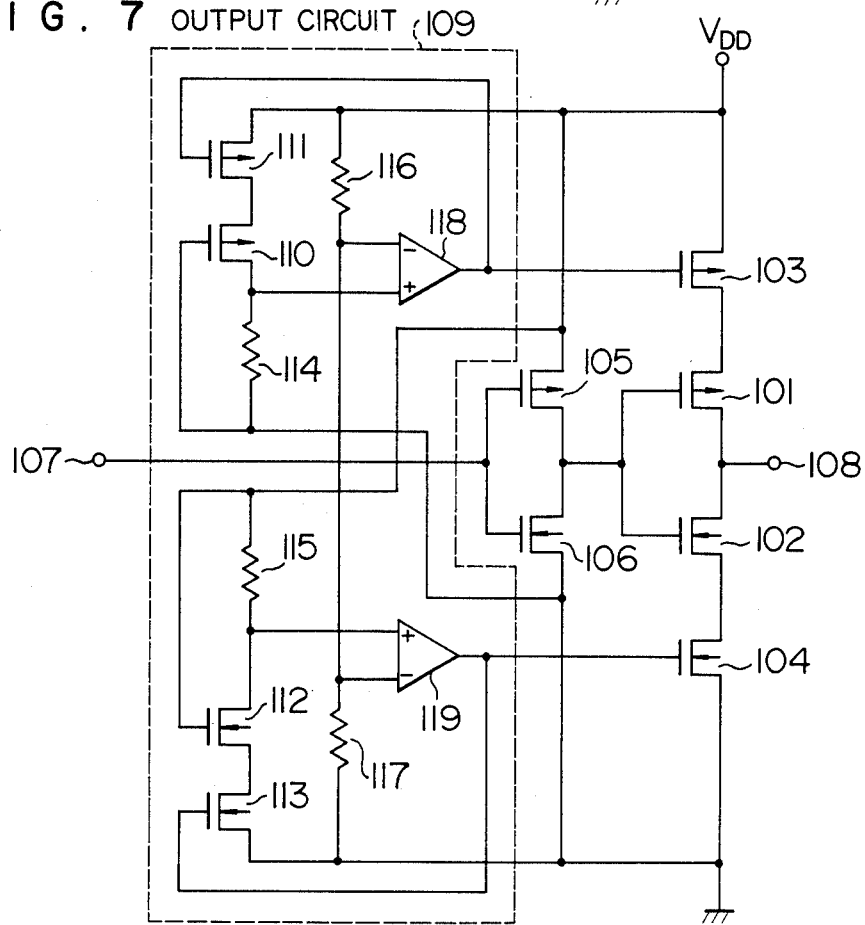

OUTPUT CIRCUIT HAVING TRANSISTOR MONITOR FOR MATCHING OUTPUT IMPEDANCE TO LOAD IMPEDANCE

BACKGROUND OF THE INVENTION

The present invention relates to an output circuit for CMOS VLSI, or more particularly, to a CMOS output circuit suitable for high-speed signal transmission between chips of a multi-chip module.

CMOS output circuits have a low output resistance value as compared with the characteristic impedance of a transmission line on a circuit board in order to improve driving capability. The CMOS input circuit has a high input impedance which generates a reflection noise on the transmission line. It is necessary to hold the received signals until this reflection noise disappears, thereby causing a great time delay in signal propagation. To avoid a circuit has been conceived which is inserted in the input circuit for absorbing an overshoot as disclosed in JP-A-No. 59-208771. If an undistorted transmission signal is to be obtained, however, matched termination of the transmission line is required. A conventional bipolar LSI is provided with a termination resistor at the receiving end of the transmission line to permit high-speed signal transmission. Since this system consumes a large amount of power in the termination resistor, however, application thereof to CMOS LSI would result in the loss of the greatest advantage that is a small power consumption of the CMOS circuit.

In a system with a termination resistor at the transmitting end of a transmission line, on the other hand, the packaging density is reduced if the termination resistor is mounted outside of the chip, thereby adversely affecting the high-integration advantage of the CMOS LSI. Although the termination resistor is desirably formed in the chip, this results in a great product variation of the element, thus posing the problem of matched termination.

International application No. WO 84/02620 published on July 5, 1984 discloses a circuit in which the reflection signal from the receiving end is prevented from being reflected at the transmitting end by rendering the output impedance of the output circuit substantially equal to the characteristic impedance of the transmission line. In the method therein the output impedance of the output circuit is substituted for the termination resistor. However, the production variations of the element causes output impedance variations of almost ±50%, and therefore this method is not satisfactory as a means for absorbing the reflection signal.

SUMMARY OF THE INVENTION

The object of the present invention is to provide a CMOS output circuit with a transmitting end termination making possible high-speed signal transmission with a small power consumption.

The output circuit according to the present invention additionally comprises a circuit which compensates for the variations in output resistance against the production variations of the element or variations in power supply voltage or temperature in order that a signal of about a half amplitude of the output signal may be always applied to the transmission line when the transmission line is connected to the output circuit to switch the output signal. In this way, an incident wave with an amplitude one half that of the output signal of the output circuit travels from the transmitting end of the transmission line, and is reflected at an open receiving end. The reflected wave returns to the transmitting end with the result that the signal amplitude at the transmitting end becomes equal to that of the output circuit, thus preventing the signal reflection at the transmitting end.

BRIEF DESCRIPTION OF THE DRAWINGS

FIG. 1 is a block diagram showing an output circuit according to an embodiment of the present invention.

FIG. 2 is a block diagram showing a control circuit for monitoring the drain current of a transistor and changing the gate width of an output transistor.

FIG. 3 is a block diagram showing an output circuit according to another embodiment of the present invention.

FIG. 4 is a circuit diagram showing an example of a differential amplifier used in the output circuit according to the present invention.

FIGS. 5, 6 and 7 are block diagrams showing other embodiments of the output circuit according to the present invention.

DESCRIPTION OF THE PREFERRED EMBODIMENTS

The present invention will be described in detail below with reference to an embodiment of the output circuit. FIG. 1 is a circuit diagram showing an output circuit according to an embodiment of the present invention.

According to the present embodiment, the transistor characteristics are controlled by being monitored so that the value of output resistance of the output circuit matches the characteristic the impedance of the transmission line. The value of the output resistor is given as the change in signal potential at an output terminal divided by the current flowing in a resistor, when one terminal of the resistor of the same value as the characteristic impedance of the transmission line being connected to the output terminal, and the other terminal thereof to a potential of a signal level opposite to the output. Once the output resistance of the output circuit is matched with the characteristic impedance of the transmission line, a signal with an amplitude half the signal amplitude of the output circuit is applied to the transmission line when the signal of the output circuit is switched. According to the present embodiment, the output resistor is controlled in accordance with the gate width of the output transistor.

In FIG. 1, reference numerals 1, 6 designate an output P channel MOS transistor and an output N channel MOS transistor respectively having a gate width necessary to obtain an output resistor equal in value to the characteristic impedance of the transmission line when an element is obtained which allows a maximum drain current to flow within the control range of the element production variations. Numerals 2 to 5 and 7 to 10 designate P channel MOS transistors and N channel MOS transistors respectively for trimming the gate width of an output transistor. The sum of the gate widths of the transistors 1 to 5 and 6 to 10 is equal to the gate width required to obtain an output resistance equal to the characteristic impedance of the transmission line impedance when an element is available which allows a minimum drain current to flow within the control range of the element production variations. The gate widths of the transistors 2 to 5 and 7 to 10 are in the ratio of 8:4:2:1 which makes possible detailed trimming of the gate width. Numeral 11 designates an inverter, numerals 12 to 15 a two-input NAND circuit, numerals 16 to 19 a two-input NOR circuit, which is a drive circuit for driving the output transistor. The gate width of the transistors of the logic circuits 11 to 19 is changed in magnitude in accordance with the gate width of the output transistors 1 to 10 in such a manner that the delay time from input to output of the output circuit may be the same regardless of the drive circuit from which the signal is applied through the output transistor. Numerals 20 and 21 designate a P channel MOS transistor and an N channel MOS transistor respectively for monitoring the drain current of the transistors. The source electrodes of these transistors 20 and 21 are connected to a power supply, that is, the P channel MOS transistor 20 is connected to $V_{DD}$, the N channel MOS transistor 21 to the ground, and the drain electrodes thereof to the resistors 22 and 23 respectively. The other terminals of the resistors 22 and 23 are connected to power supplies respectively, that is, the resistor 22 is connected to the ground and the resistor 23 to $V_{DD}$. The gate electrode of the P channel MOS transistor 20 is connected to the ground, and the gate electrode of the N channel MOS transistor 21 to $V_{DD}$. Numeral 24 designates a circuit for controlling the gate width of the output P channel MOS transistor, and is supplied with a voltage across the resistor 22 for observing the drain current of the monitoring P channel MOS transistor 20. In accordance with this voltage, a signal 26 for designating transistors to be turned on among the trimming P channel MOS transistors 2 to 5 is produced. The transistors to be turned on are impressed with a "high" signal, and those transistors not to be turned on with a "low" signal. These signals are applied to the NAND circuits 12 to 15 together with a data input signal thereby to produce a "NAND" output, thus turning on only the designated ones of the output P channel MOS transistors 2 to 5. Numeral 25 designates a circuit for controlling the gate width of the output N channel MOS transistor, which like the circuit 24, is supplied with a voltage across the resistor 23 for observing the drain current of the monitoring N channel MOS transistor 21, in accordance with which a signal 27 is produced for designating those of the trimming N channel MOS transistors 7 to 10 to be turned on. The transistors to be turned on are supplied with a "low" signal, and those not to be turned with a "high" signal. Those signals are applied to the NOR circuits 16 to 19 together with a data input signal thereby to turn on only the esignated ones of the output N channel MOS transistors 7 to 10. The control signals 26, 27 are supplied to all the output circuits within the LSI chip, and the gate width of the output transistor is automatically regulated to attain coincidence between the output resistor and the characteristic impedance of the transmission line.

FIG. 2 shows an embodiment of the control circuit 24. Numeral 30 identifies an A/D converter ciruciut for converting the voltage across the resistor 22 into a digital value, and numeral 31 identifies a subtractor circuit for producing the difference between two binary inputs A and B. Each of these circuits is configured of a well known circuit-producing technique. The value of the resistor 22 and the resolution of the A/D converter circuit 30 are selected in such a manner that the difference between maximum and minimum drain currents within the control range of production variations of the P channel MOS transistor 20 may be given by the four least significant four bits of the output of the A/D converter circuit 30. A resistor of a high accuracy like this is obtained by the well-known ion injection method used for analog IC or by adjusting the resistance value with a plurality of diffusion resistors formed in advance, using such means as laser trimming. In spite of a disadvantage for LSI packaging, the resistor may be connected externally, if desired. Assume that an output "11010" is produced by the A/D converter circuit 30 when a P channel MOS transistor 20 with maximum drain current is obtained, and an output "01011" thereof when the same transistor 20 with minimum drain current is obtained. If the input A of the subtractor circuit 31 is set to "11010", an output "00000" is obtained when the input B, that is the output of the A/D converter circuit 30, is "11010", and an output of "01111" when the input B is "01011". If the least significant four bits of the output of the subtractor circuit 31 are used as a control signal 26, only the output P channel MOS transistor 1 is turned on when a P channel MOS transistor with maximum drain current is produced, while all the output P channel MOS transistors 1 to 5 are turned on when a P channel MOS transistor with minimum drain current is obtained. As a result, the output resistor of the output circuit can be rendered to match the characteristic impedance of the transmission line by controlling the gate width of the output transistors turned on in accordance with the magnitude of the drain current within the control range of the element production variations. The control circuit 25 may be configured the same way as the control circuit 24 but with different polarities of the control signal 27.

According to the present embodiment, the output transistor is divided into five parts, and may be divided into different numbers of parts in accordance with the control accuracy. In the case where the output of the subtractor circuit 31 becomes negative or a bit more significant than the bits used as a control signal 26 becomes 1, it indicates that the magnitude of the drain current of the transistor has exceeded the control range of production variations. This phenomenon can be used for selecting an LSI chip. Further, in the case where the output of the A/D converter circuit 30 can be selected as "11111" associated with maximum drain current, and "10000" associated with minimum drain current, an inverter or the like may be used instead of the subtractor circuit. The monitor MOS FET 20, 23 are such that not only the characteristic variations for MOS FET production but also output resistance variations due to changes in drain current of the output MOS FET, caused by variations in power supply or temperature, can also be compensated for in view of the fact that the gate width of the output MOS FET can be controlled by changing the MOS FET to be turned on upon detection of a change in the drain current of the monitor FET.

In the aforementioned embodiment, the output transistor is divided and the gate width thereof is changed by applying a control signal to the respective drive circuits. In place of this method, the wiring to the gate electrode of the output transistor may be cut off by laser beam. Also, instead of an output circuit of CMOS inverter type, the present invention may be applied with equal effect to another circuit configuration such as one comprising two N channel MOS transistors in series with data input of opposite phases applied to the gates thereof to produce an output from the connecting point of the N channel MOS transistor.

Further, the circuit according to the present embodiment in which the output resistance is adjusted by changing the gate width of the output transistor may be replaced with another means. For example, the output of a CMOS inverter circuit is connected with one of the parallel-connected source and drain electrodes of an N channel MOS transistor and a P channel MOS transistor, with the other elecrode used as an output terminal. By controlling the gate voltage of these P channel MOS transistor and N channel MOS transistor, it is possible to adjust the output resistor.

Further, the inverter in the above-mentioned embodiment may be replaced with a NAND circuit (for driving the output P channel MOS FET1) and a NOR circuit (for driving the output N channel MOS FET2) and the number of the inputs to NAND circuits 12 to 15 and NOR circuits 16 to 19 may be increased to include a NOT signal as an enable input signal, thus realizing an output circuit of tri-state type.

In the aforementioned embodiment, the amplitude of the signal applied to the transmission line is about one half that of the output signal, and therefore the output resistance of the output circuit is controlled to coincide with the characteristic impedance of the transmission line by the gate width of the output transistor. As an alternative construction, the input signal potential of the output transistor may be controlled while monitoring the transistor characteristics in such a manner that the amplitude of the signal applied to the transmission line may be almost one half of the amplitude of the output signal.

An embodiment in which the input signal potential of the output transistor is controlled will be explained with reference to FIG. 3. In FIG. 3, numeral 1 designates a P-channel output MOS FET, and numeral 6 and N-channel output MOS FET. MOS FETs 33 to 35 and 36 to 38 connected in series make up drive circuits 39 and 40 for driving the MOS FETs 1 and 6. Numerals 33, 34 and 36 designate P-channel MOS FETs, and numerals 35, 37 and 38 N-channel MOS FETs. The gate electrodes of the MOS FETs 33, 35 and 36 are connected to an input terminal 41 of the output circuit, while the gate electrode of the MOS FETs 34 and 37 to the output of the control voltage generator circuit 42. The output of the drive circuit 39 is collected from the junction point of the source electrode of the P channel MOS teransistor 33 and the drain electrode of the P channel MOS transistor 34, and is connected to the gate electrode of the P channel MOS transistor 1. The output of the drive circuit 40 is collected from the junction point of the source electrode of the N channel MOS FET 37 and the drain electrode of the N channel MOS FET 38, and is connected to the gate electrode of the N channel MOS FET 6. The output terminal 43 of the output circuit is connected to the drain electrodes of the P channel MOS FET 1 and the N channel MOS FET 2. Character $V_{DD}$ designates a power supply terminal. The control voltage generator circuit 42 includes P channel MOS FETs 44, 45 and N channel MOS FETs 46, 47, resistors 48 to 51, and differential amplifiers 52 and 53. The P channel MOS FET 45 and the N channel MOS FET 47 function to monitor the characeristics of the FET formed on the chip. The value of the resistor 48 is given as $(W_1/W_{45}) Z_0$ and the value of the resistor 49 as $(W_6/W_{47}) Z_0$ where $W_1$, $W_6$, $W_{45}$ and $W_{47}$ are the gate widths of the MOS FETs 1, 6, 45 and 47 respectively, and $Z_0$ the characteristic impedance of the transmission line connected to the output terminal 43 of the output circuit.

The junction between the drain electrode of the P channel MOS FET 45 and the resistor 48 is connected to the positive-phase input of the differencial amplifier 52, and the junction between the drain electrode of the N channel MOS transistor 47 and the resistor 49 is connected to the positive-phase input of the differential amplifier 53. Also, the resistors 50 and 51 have the same resistance value and supply a voltage $V_{DD}/2$ to the inverted input of the differencial amplifiers 52 and 53. The output of the differential amplifiers 52 and 53 are connected to the gate electrodes of the MOS FETs 44 and 46 respectively, while the source of the MOS FETs 44 and 46 are connected to the gate electodes of the MOS FETs 45 and 47 respectively. The functions of the control voltage generator circuit 42 will be explained with reference to the side thereof generating an output to the gate electrode of the P channel MOS FET 34. Assume that the P channel MOS FET is so finished that more drain current than the typical value flows therein. The drain electrode potential of the P channel MOS FET 45 increases, and with the resultant increase in the output potential of the differential amplifier 52, the potential of the gate electrode of the P channel MOS FET 44 also rises. As a result, the potential of the source of the P channel MOS FET 44, that is, the potential of the gate electrode of the P channel MOS FET 45 increases, while the drain current thereof decreases. If the gain of the differential amplifier 52 is sufficiently high, the positive-phase input and the inverted-phase input thereof are rendered substantially equal in potential by feedback. The potential of the drain electrode of the P channel MOS FET 45 is maintained almost at $V_{DD}/2$, so that the drain current of the P channel MOS FET 45 is controlled at a fixed value $$\frac{\frac{V_{DD}}{2}}{\frac{W_1}{W_{45}} Z_0}$$

regardless of the variations in the FET characteristics thereof. If the P channel MOS FET is so finished that less drain current flows than the typical value, on the other hand, the gate electrode potential of the P channel MOS FET 45 drops and is controlled to render the drain current substantially equal to the typical design value. The P channel MOS FET 33 cuts off and the N channel MOS FET 35 conducts when the input signal level to the input terminal 41 of the output circuit is high ($V_{DD}$). As a result, the potential of the drain electrode of the N channel MOS FET 35, that is, the potential of the drain electrode of the P channel MOS FET 34 is reduced to ground level. Since the characteristics variations of the MOS FET in the chip are sufficiently small as compared with the variations between chips, by applying this output of the control voltage generator circuit to the gate electrode of the P channel MOS FET 34, the gate electrode potential of the P channel MOS FET 1 becomes equal to that of the P channel MOS FET 45. In the case where the input signal level to the input terminal 41 of the output circuit is low (OV) by contrast, the P channel MOS FET 33 conducts and the N channel MOS FET 35 cuts off, and therefore the gate electrode potential of the P channel MOS FET 1 becomes $V_{DD}$.

In this way, if the output terminal 43 of the output circuit is connected to the transmission line of the characteristic impedance $Z_0$, and an input signal changing from low to high level is applied thereto (the output terminal 43 is assumed to be at ground potential initially), therefore, it is possible to apply a current expressed by $$\frac{W_1}{W_{45}} \cdot \frac{\frac{V_{DD}}{2}}{\frac{W_1}{W_{45}} Z_0}$$

that is, $$\frac{\frac{V_{DD}}{2}}{Z_0}$$

thereby to supply the first wave with the amplitude of $V_{DD}/2$ to the transmission line without regard to the variations in the FET characteristics.

The same applies to the lower side of the control voltage generator circuit connected to the gate electrode of the N channel MOS FET 37, and the characteristic variations of the N channel MOS FET are compensated so that when an input signal changing from high to low level is applied to the input terminal 41 of the output circuit (assuming that the output terminal 43 is $V_{DD}$ in potential in initial stage), the current of $$\frac{\frac{V_{DD}}{2}}{Z_0}$$

from the transmission line can be absorbed and the first wave with the amplitude of $V_{DD}/2$ can be applied to the transmission line regardless of the variations in the FET characteristics. In this way, the first wave having an amplitude about one half of the signal amplitude $V_{DD}$ of the CMOS output circuit can be always applied to the transmission line, and therefore this first wave is reflected on the open receiving end, followed by the second wave of the same aplitude travelling from the receiving end to the transmitting end (output circuit), thus producing an amplitude of the CMOS output circuit. When this second wave reaches the transmitting end, the potential of the output terminal 43 of the output circuit is reduced to the earth potential while the P channel MOS FET 1 cuts off and the N channel MOS FET 6 conducts, if the input terminal 41 of the output circuit is "low". On the other hand, the potential of the output terminal 43 of the output circuit is raised to $V_{DD}$ while the P channel MOS FET 1 conducts and the N channel MOS FET 6 cuts off, if the input terminal 41 is "high". Thus the signal is not reflected at the transmitting end, and the incident wave from the output circuit ceases to reflect after one reciprocation.

Even if the FET characteristic of the control voltage generator circuit 42 undergoes variations with temperature, such variations, as well as the ones due to MOS FET production can be compensated for in view of the fact that the temperature on the chip is considered substantially constant. Also, in the event that the power supply voltage changes causing changes in the drain current flowing in the output MOS FET or the output amplitude of the CMOS output circuit, the drain potential of the P channel MOS FET 45 and N channel MOS FET 47 are rendered to keep $V_{DD}/2$, so that the signal amplitude of the first wave of the output circuit also becomes $V_{DD}/2$, thus compensating for the variations. The accuracy of the resistance value of resistors 48 to 51 in the circuit according to the present embodiment are directly related to the compensation accuracy of the control voltage generator circuit 42. Especially, the resistors 48, 49, the accuracy of the absolute resistance value of which is important, requires a resistance of high accuracy. A resistor of a high accuracy like this is obtained by the well-known ion injection method used for an analog IC or by adjusting the resistance value with a plurality of diffusion resistors formed in advance, using such means as laser trimming. In spite of a disadvantage for LSI packaging, the resistor may be connected externally, if desired.

An example of the differential amplifiers 52, 53 used in the present embodiment is shown in FIG. 4. Numerals 124, 125 designate a P channel MOS FET, and numerals 126, 127 128 an N channel MOS FET, making up a differential amplifier circuit. A P channel MOS FET 129 and an N channel MOS FET 130, on the other hand, constitute a CMOS inverter. This differential amplifier is constructed in double stages in this way. Numeral 131 designates a positive-phase input terminal, numeral 132 a reverse-phase input terminal, and numeral 133 an output terminal. Numeral 134 designates a bias power terminal for the N channel MOS FET 128 providing a current source of the differential amplifier circuit. Without providing a special source voltage, however, the circuit may be connected to the power supply voltage $V_{DD}$.

In the circuit of FIG. 3, the P channel MOS FET 34 may be interposed between the source of the N channel MOS FET 35 and the grounded power supply. In similar manner, the N channel MOS FET 37 may be inserted between the source of the P channel MOS FET 36 and the power supply $V_{DD}$.

FIG. 5 shows an embodiment of the output circuit of FIG. 3 modified into an output circuit of tri-state type. The drive circuit 39 of FIG. 3 is replaced by a drive circuit 430 including a two-input NAND circuit having P channel MOS FETs 135, 136 and N channel MOS FETs 137, 138 and a P channel MOS FET 34 inserted between the output terminal thereof and an N channel MOS FET 137. The drive circuit 40, on the other hand is replaced by a drive circuit 440 including a two-input NOR circuit having P channel MOS FETs 139, 140 and N channel MOS FETs 141, 142 and an N channel MOS FET 37 interposed between the output terminal thereof and the N channel MOS FET 140. The gate electrode 145 of the P channel MOS FET 34 is connected, like in FIG. 3, with the output of the differential amplifier 52 of the control voltage generator circuit 42 (not shown), while the gate of the N channel MOS FET 37 with the output of the differential amplifier 53 of the control voltage generator circuit 42. The input of the two-input NAND circuit 430 is connected to the enable input terminal 147 and the data input terminal 41. The input of the two-input NOR circuit 400 is connected to the output of an inverter 500 including an N channel MOS FET 149 and a P channel MOS FET 148 with the input thereof connected to the data input terminal 41 and the enable input terminal. When the enable input is "low", therefore the output of the drive circuit 430 becomes $V_{DD}$, and the output of the drive circuit 440 the ground potential, so that the output MOS FETs 1 and 6 are both cut off, resulting in a high-impedance output. When the enable input is "high" and the data input "low", on the other hand the output of the drive circuit 430 is $V_{DD}$, and the output of the drive circuit 440 takes a potential equal to the gate electrode of the monitoring N channel MOS FET 47 of the control voltage generator circuit 42 by the functions of the N channel MOS FET 37, with the result that the output P channel MOS FET 1 is cut off, while the output N channel MOS FET 6 conducts. When the enable input is "high", and the data input is also "high", the function of the P channel MOS FET 34 renders the output of the drive circuit 430 equal to the gate electrode potential of the monitoring P channel MOS FET 45 of the control voltage generator circuit 42, and the output of the drive circuit 440 equal to the earth potential, so that the output P channel MOS FET 1 conducts while the output N channel MOS FET 6 cuts off. The function of the control voltage generator of this embodiment is the same as in the embodiment shown in FIG. 3, whereby the first wave having an amplitude one half the signal amplitude $V_{DD}$ of the CMOS output circuit is capable of being applied to the transmission line connected to the output terminal without regard to the variations in the FET characteristics, power supply voltage or temperature, thus preventing the signal from being reflected more than once. In FIG. 5, as in the embodiment of FIG. 3, the P channel MOS FET 34 may be inserted between the N channel MOS FET 138 and the ground power supply, the N channel MOS FET 37 between the P channel MOS FET 139 and the power supply $V_{DD}$.

FIG. 6 shows another embodiment of the present invention, in which the control voltage generator circuit 42 (not shown) is the same as that in FIG. 3, while a different drive circuit is included for driving the output MOS FETs 1 and 6. An inverter 530 including a P channel MOS FET 151 and an N channel MOS FET 152 is a drive circuit for both the output P channel MOS FET 1 and the output N channel MOS FET 6. A P channel MOS FET 34 and an N channel MOS FET 37 are inserted between the output of the inverter 530 and the gate electrode of the P channel MOS FET 1 and between the output of the inverter 530 and the gate electrode of the N channel MOS FET 6 respectively. The gate 145 of the P channel MOS FET 34 is connected with the output of the differential amplifier 52 of the control voltage generator circuit 42 as in FIG. 3, and the gate electrode 146 of the N channel MOS FET 37 is connected with the output of the differential amplifier 53 of the control voltage generator circuit 42. The potential of the gate electrode 145 of the P channel MOS FET 34 is lower than the power supply voltage $V_{DD}$ at least by the sum of the absolute values of the threshold voltage of the P channel MOS FETs 44 and 45, while the potential of the gate electrode 146 of the N channel MOS FET 37 is higher than the earth potential by at least the sum of the absolute values of the threshold values of the N channel MOS FETs 46 and 47. When the input signal to the input terminal 41 is "low", therefore, the P channel MOS FET 151 conducts and the N channel MOS FET 152 is cut off, so that the output potential of the inverter 530 becomes $V_{DD}$. As a result, the gate electrode of the output P channel MOS FET 1 becomes equal to $V_{DD}$, and the gate electrode of the output N channel MOS FET 6 equal to the gate electrode potential of the monitoring N channel MOS FET 47 of the control voltage generator circuit 42. When the input signal to the input terminal 41 is "high", on the other hand, the P channel MOS FET 151 cuts off, and the N channel MOS FET 152 conducts, so that the output potential of the inverter 530 becomes equal to ground potential. As a result, the gate electrode of the output P channel MOS FET 1 becomes equal to the gate electrode potential of the monitoring P channel MOS FET 45 of the control voltage generator circuit, and the gate electrode potential of the output N channel MOS FET 6 equal to ground potential. In this way, as in the embodiment shown in FIG. 3, the signal on the transmission line connected to the output terminal is prevented from being reflected more than once.

FIG. 7 shows another embodiment of the present invention. Unlike in the embodiments of FIGS. 3, 5 and 6 in which the gate-source voltage of an output MOS FET is controlled to keep constant the drain current in a load despite the variations in the FET characteristics, the present embodiment is such that MOS FETs 103 and 104 for keeping constant the drain current in a load are inserted between a power supply and output MOS FETs 101, 102 which is a logic circuit (for increasing or decreasing the output to "low" or "high" level). Numerals 101, 103 designate a P channel MOS FET, and numerals 102, 104 and N channel MOS FET. The P channel MOS FET 105 and the N channel MOS FET 106 make up an inverter (drive circuit) for driving the output MOS FET 101, 102. Numeral 107 designates an input terminal to the output circuit, and numeral 108 an output terminal. The control voltage generator circuit 109 for supplying a control voltage to the gate electrode of the P channel MOS FET 103 and the N channel MOS FET 104 is similar to the circuit in the embodiment of FIG. 1, but different therefrom in the connection of the monitoring MOS FETs 110 to 113. Numeral 110, 111 designates a P channel MOS FET, and numeral 112, 113 an N channel MOS FET. Assuming that the gate widths of the MOS FETs 101, 102, 103, 104, 110, 111, 112 and 113 are $W_{101}$, $W_{102}$, $W_{103}$, $W_{104}$, $W_{110}$, $W_{111}$, $W_{112}$, and $W_{113}$, the relations hold that $W_{110}/W_{101} = W_{111}/W_{103}$, and $W_{112}/W_{102} = W_{113}/W_{104}$. The value of the resistor 114 is given as $(W_{103}/W_{111}) Z_0$ and that of the resistor 115 as $(W_{104}/W_{113}) Z_0$. The P channel MOS FETs 111, 110 and the resistor 114 are connected in series, and the junction point of the P channel MOS FET 110 and the resistor 114 to the positive-phase input of the differential amplifier 118. In similar fashion, the resistor is connected in series with the N channel MOS FETs 112 and 113, and the junction point of the resistor 115 and the N channel MOS FET 112 to the positive-phase input of the differential amplifier 119. The inverted inputs of the differential amplifiers 118 and 119 are supplied with a voltage equivalent to $V_{DD}/2$ by the resistors 116 and 117 equal in resistance value. The circuit as shown in FIG. 4, for example, is used as the differential amplifier 118, 119 are connected to the gate electrodes of the P channel MOS FETs 111 and 103, and the N channel MOS FETs 113 and 104 respectively. The gate electrode of the P channel MOS FET 110 is grounded, and the gate of the N channel MOS FET 112 is connected to the power supply $V_{DD}$. In the same manner as in the embodiment of FIG. 1, if the gain of the differential amplifier 118, 119 is sufficiently high, the gate electrode potential of the MOS FETs 111 and 113 is controlled in such a manner as to keep the potential of the gate electrode of the MOS FETs 110 and 112 at $V_{DD}/2$ regardless of the variations in FET characteristics, power supply voltage or temperature. This control voltage is supplied to the gate electrodes of the MOS FETs 103 and 104. Therefore, if the output terminal 108 is connected to the transmission line of the characteristic impedance $Z_0$, and the input terminal 107 with an input signal changing from "low" to "high" level (the output terminal 108 kept at the earth potential initially), then the N channel MOS FET 106 conducts, and the P channel MOS FET 105 cuts off. Also, the P channel MOS FET 101 conducts, while the N channel MOS FET 102 cuts off, thus keeping the potential of the output terminal 108 at $V_{DD}/2$. This first wave is reflected at the open receiving end, and the potential becomes $V_{DD}$, followed by the reflected wave returning to the output terminal 108 to end the reflection. In the case where an input signal changing from "high" to "low" level is applied to the input terminal 107 (assuming that the output terminal 108 is at potential $V_{DD}$ initially), on the other hand, the P channel MOS FET 105 conducts, the N channel MOS FET 106 cuts off, N channel MOS FET 102 conducts, and the P channel MOS FET 101 cuts off, thus rendering the potential of the output 108 $V_{DD}/2$. This first wave becomes the earth potential by being reflected at the open receiving end, and when the reflected wave returns to the output terminal 108, the reflection ends. In this embodiment, the P channel MOS FET 101 may alternatively be interposed between the P channel MOS FET 103 and the power supply $V_{DD}$, the N channel MOS FET 102 between the N channel MOS FET 104 and the earth power supply, the P channel MOS FET 110 between the P channel MOS FET 111 and the power supply $V_{DD}$, and the N channel MOS FET 112 between the N channel MOS FET 113 and the earth power supply. Also, the drive circuit for the output MOS FET 101, 102, may be replaced by a NAND circuit and a NOR circuit, modification into a tri-state output circuit is possible.

All the MOS FETs in the embodiment under consideration may be of enhancement type. If a depletion type of P channel MOS FET 34, 44, and N channel MOS FET 37, 46 are used, however, it is possible to secure a large gate-source voltage and a small gate width between the output MOS FETs 1 and 2, thereby permitting more effective utilization of the cell area. This is also the case with the P channel MOS FET 103, 111 and N channel MOS FET 104, 113, which if depletion type, can be smaller in gate width, thereby making it possible to utilize the cell area more effectively.

Although no direct current flows in the CMOS circuit, that is not true of the control voltage generator circuit according to the embodiments of the present invention. Nevertheless, in view of the fact that at least only one control voltage generator circuit meets the requirements for a multiplicity of output circuits mounted on an LSI chip, the control voltage generator circuit does not pose any substantial problem of an increased power consumption or cell area.

It will thus be understood from the foregoing description that according to the present invention, the transmission line connected to an output circuit can be provided with transmitting and receiving ends within an LSI chip, thereby making possible high-speed signal transmission between LSI chips. Further, since the output circuit is of CMOS type, power consumption is minimized.

In the sending and receiving end type of transmission system, the signal time delay increases with the approach to the transmitting end. For a signal where such a signal time delay is not allowable, the loads should be divided into groups far from and near to the LSI chip which are driven by different output circuits.

What is claimed is:
1. An output circuit comprising:
output transistor means for applying an output signal to a transmission line connected to an output terminal;
drive means for driving said output transistor means in response to an input signal supplied from an input terminal; and
control means for controlling said output transistor means so that the output impedance of said output transistor means is approximately equal to the characteristic impedance of said transmission line, said control means having a transistor circuit which is connected to a power supply and which is provided in the same chip as said output transistor means, and a control circuit for generating a control signal for said output transistor means in accordance with the magnitude of the current which flows in said transistor circuit from said power supply.
2. An output circuit according to claim 1 wherein said output transistor means include a plurality of transistors connected in parallel to said output terminal, the output resistance of said output transistor means being adjusted by selectively activating said transistors.
3. An output circuit according to claim 2 wherein said transistors include n transistors having the gate width of $W_0 \cdot 2^{i-1}$, where $W_0$ is a gate width of first transistor, and $1 \leq i \leq n$.
4. An output circuit according to claim 3 wherein said control circuit generates as said control signal a signal for selectively actuating several ones of said transistors.
5. An output circuit according to claim 1 wherein said output transistor means include at least a first P channel FET and a first N channel FET, the drains of said FETs being connected to provide said output terminal.
6. An output circuit according to claim 5 wherein said drive means includes a first drive circuit for driving the gate of said first P channel FET and a second drive circuit for driving the gate of said first N channel FET, and said transistor circuit includes a monitoring P channel and N channel FETs, and said control circuit generates as said control signal first and second control voltages for adjusting a low-level potential of the output signal of said first drive circuit and a high-level potential of said second drive circuit.
7. An output circuit according to claim 6 wherein said first drive circuit includes a CMOS inverter for receiving said input signal and a second P channel FET connected in series between the output terminal of said first drive circuit and a power supply, the gate of said second P channel FET being supplied with said first control voltage from said control means, and said second drive circuit includes a CMOS inverter for receiving said input signal and a second N channel FET connected in series between the output terminal of said second drive circuit and a power supply, the gate of said second N channel FET being supplied with said second control voltage from said control means.
8. An output circuit according to claim 6 wherein said first drive circuit includes a two-input NAND circuit and a second P channel FET, the gate of which is supplied with said first control voltage from said control means, and said second drive circuit includes a two-input NOR circuit and a second N channel FET, the gate of which is supplied with said second control voltage from said control means.

9. An output circuit according to claim 5 wherein said drive means includes a CMOS inverter receiving said input signal, a second P channel FET connected between the output of said CMOS inverter and the gate of said first P channel FET, the gate-source voltage of said first P channel FET being regulated by regulating the gate potential of said second P channel FET, a second N channel FET being connected between the output said CMOS inverter and the gate of said first N channel FET, the gate-source voltage of said first N channel FET being regulated by regulating the gate potential of said second N channel FET.

10. An output circuit according to claim 6 wherein said monitoring P channel FET has a gate width 1/a, wherein a is an integer, times that of said first P channel FET, and is coupled to one of the terminals of a first resistor having a resistance value $aZ_0$, with $Z_0$ being the characteristic impedance of the transmission line, and a positive-phase input of a first differential amplifier, the output of said first differential amplifier is coupled to said first drive circuit and a second P channel FET, the source of the second P channel FET is coupled to the gate of the monitoring P channel FET, the other terminal of said first resistor is coupled to a negative power supply, said monitoring N channel FET, has a gate width 1/b wherein b is an integer times that of the first N channel FET, and is coupled to one of the terminals of a second resistor having a resistance value $bZ_0$ and a positive-phase input of a second differential amplifier, the output of the second differential amplifier is coupled to said second drive circuit and a second N channel FET, the source of the second N channel FET is coupled to the gate of the monitoring N channel FET, the other terminal of the second resistor is coupled to a positive power supply, and inverting inputs of the first and second differential amplifiers are coupled to a central potential of positive and negative power supplies.

11. An output circuit according to claim 9 wherein said monitoring P channel FET has a gate width 1/a wherein a is an integer times that of said first P channel FET, and is coupled to one of the terminals of a first resistor having a resistance value $aZ_0$, wherein $Z_0$ is the characteristic impedance of the transmission line, and a positive-phase input of a first differential amplifier, the output of said first differential amplifier is coupled to the gates of the second P channel FET and a third P channel FET, the source of the third P channel FET is coupled to the gate of the monitoring P channel FET, the other terminal of said first resistor is coupled to a negative power supply, said monitoring N channel FET has a gate width 1/b wherein b is an integer times that of the first N channel FET and is coupled to one of the terminals of a second resistor having a resistance value $bZ_0$ and a positive-phase input of a second differential amplifier, the output of the second differential amplifier is coupled to the gates of the second and third N channel FETs, the source of the third N channel FET is coupled to the gate of the monitoring N channel FET, the other terminal of the second resistor is coupled to a positive power supply, and inverting inputs of the first and second differential amplifiers are coupled to a central potential of the positive and negative power supplies.

12. An output circuit according to claim 1 wherein said output transistor means includes first transistors for rendering the output terminal low or high, and second transistors for adjusting the output current, said first and second transistors are connected in series with each other.

13. An output circuit according to claim 12 wherein said first transistors and said second transistors are FETs, said control means includes monitoring transistor circuits with third FETs having gate widths 1/c wherein c is an integer times that a gate width of the first FETs, making up the first transistors, and with fourth FETs having gate widths 1/c times a gate width of the second FETs making up the second transistor, and third resistors having a resistance value $cZ_0$, said third resistors having terminals not connected to the power supply but to a positive-phase input of differential amplifiers, inverting inputs of said differential amplifiers are connected to a central potential between the highs and lows of the output terminal, the output of said differential amplifiers are connected to the gates of said second and fourth FETs.

* * * * *